United States Patent [19]
Walsh

[11] Patent Number: 5,995,006
[45] Date of Patent: Nov. 30, 1999

[54] RADIO FREQUENCY TAG

[75] Inventor: Brian John Hugh Walsh, Dunbartonshire, United Kingdom

[73] Assignee: Intermec IP Corp., Woodland Hills, Calif.

[21] Appl. No.: 09/029,432

[22] PCT Filed: Jan. 15, 1996

[86] PCT No.: PCT/GB96/00061

§ 371 Date: Mar. 5, 1998

§ 102(e) Date: Mar. 5, 1998

[87] PCT Pub. No.: WO97/09641

PCT Pub. Date: Mar. 13, 1997

[30] Foreign Application Priority Data

Sep. 5, 1995 [GB] United Kingdom ............... 9518053

[51] Int. Cl.$^6$ ............................................. G08B 13/14
[52] U.S. Cl. .................... 340/572.7; 340/572.1; 340/572.8; 340/825.3; 340/825.34; 340/825.54; 343/720
[58] Field of Search ................. 340/572.1, 825.34, 340/551, 572.7, 572.8, 825.54, 572.9, 568.1, 825.3, 693.5, 539; 257/678, 679, 684; 343/866, 720, 907, 908, 878, 867, 793, 872; 342/44

[56] References Cited

U.S. PATENT DOCUMENTS

| | | | |
|---|---|---|---|
| 5,313,193 | 5/1994 | Dubois et al. ................. | 340/572.7 |
| 5,406,263 | 4/1995 | Tuttle ............................ | 340/572.8 |
| 5,430,441 | 7/1995 | Bickley et al. ................. | 340/825.54 |
| 5,528,222 | 6/1996 | Moskowitz et al. ............ | 340/572.7 |
| 5,574,470 | 11/1996 | De Vall ........................ | 343/895 |
| 5,682,143 | 10/1997 | Brady et al. ................... | 340/572.7 |
| 5,710,458 | 1/1998 | Iwasaki ......................... | 257/679 |
| 5,880,675 | 3/1999 | Trautner ....................... | 340/572.8 |

FOREIGN PATENT DOCUMENTS

| | | |
|---|---|---|
| 0 149 240 | 7/1985 | European Pat. Off. . |
| 0 595 549 | 5/1994 | European Pat. Off. . |
| 7903841 | 11/1979 | Netherlands . |
| 2 255 692 | 11/1992 | United Kingdom . |
| 2 286 948 | 8/1995 | United Kingdom . |

*Primary Examiner*—Benjamin C. Lee

[57] ABSTRACT

Disclosed is a radio frequency identification (RF ID) tag which is adapted for use in identifying electronic and/or electrical systems which incorporate electronic components mounted on a printed circuit board (PCB). The RF ID tag comprises semiconductor circuitry contained within an electronic package, which package is mounted onto the PCB. In addition to the various components and circuitry of the tagged system, the PCB includes the RF antenna portion of the tag defined either in or on the PCB. The package is connected to the antenna via pads on the PCB.

2 Claims, 1 Drawing Sheet

RADIO FREQUENCY TAG

This invention relates to the field of radio frequency (RF) tagging and more particularly to improved radio frequency tag apparatus.

Radio Frequency Identification (RF ID) is one of a variety of types of technology used for object identification. The heart of an RF ID system is the information carrying tag which functions in response to a coded RF signal received from a base station. Typically, the tag reflects the incident RF carrier back to the base station. Information is transferred as the reflected signal is modulated by the tag according to its programmed information protocol.

An RF ID tag generally comprises a semiconductor chip having RF circuits, logic and memory. The tag also includes an antenna, often a collection of discrete components, capacitors and diodes for example, a battery (in the case of active tags), a substrate for mounting the components and interconnections between the components. These elements are contained within a physical enclosure. One type of tag—the passive tag—has no battery and functions by deriving energy from the RF signal used to interrogate the tag. In general, RF ID tags are manufactured by mounting the individual elements onto a circuit card. This is done using either short wire bond connections of soldered connections between the board and the circuit elements; chip, capacitors, diodes, antenna. The circuit card may be of epoxy-fibreglass composition or ceramic. The antennas are generally loops of wire soldered to the circuit card or consist of metal etched or plated on the circuit card. The whole assembly may be enclosed in a plastic box or moulded into a three dimensional plastic package, ready for attachment to the article to be tagged. In an alternative arrangement, the tag may comprise a unitary package incorporating all the tag components, including a coil antenna. In use, this latter type of tag is fixed to the article being tagged.

While the application of RF ID technology is not as widespread as other ID technologies, e.g. bar code, RF ID is becoming pervasive in certain markets e.g. vehicle identification. Another use proposed for RF ID technology is inventory management e.g. in a manufacturing and warehousing environment. The location of an article of manufacture (e.g. electrical/electronic component or system) at various stages of the manufacturing and handling process can be achieved by interrogating an RF ID tag attached to a unit of manufacture. In addition, an RF ID tag can be employed on such articles to prevent theft from the place of manufacture or from any other area where the article is subsequently kept e.g. in customer premises. At present, the cost of an RF ID tag prevents as use on all but high value items. As the cost of tags decreases, use will become more widespread.

GB-A-2255692 discloses an antenna circuit for a non-contact type portable storage device, in which the antenna coil is formed onto the card of the device. The storage device is not designed to tag a further electronic apparatus.

One disadvantage of prior RF tags is their relatively large size, due in part to the space required to provide a suitably efficient antenna. Furthermore, the overall manufacturing cost and complexity of the tag is relatively high in that it includes the cost of providing a circuit card carrier including integral antenna. The overall cost and size can therefore determine/limit the applications of an RF ID tag.

The present invention seeks to provide RF ID tagging apparatus which provides low cost tagging of electrical and/or electronic components and systems.

Accordingly, in one aspect of the invention, there is provided an electronic apparatus comprising: at least one integrated circuit device mounted on a printed circuit board; and a radio frequency tag for tagging the electronic apparatus and comprising signal processing logic and memory contained in an electronic package mounted on the circuit board, the tag further comprising antenna means for receiving radio frequency signals and transmitting radio frequency signals modulated in accordance with apparatus identification data stored in the memory, the antenna means being defined in one or more metal layers of the circuit board and electrically connected to the signal processing logic and memory of the tag via electrical connectors of the electronic package.

In this way, RF ID tagging is achieved by integrating the RF antenna of the tag into a printed circuit board of the electrical system being tagged. No separate antenna-carrying substrate is required thereby reducing the overall size of the tag and also simplifying the tag manufacturing process. Furthermore, a tag apparatus in accordance with the present invention has the additional advantage over the 'unitary' type of tag described above in that it is in effect 'built-in' to the article being tagged, making unauthorised removal more difficult.

The antenna is defined in one or more metal layers of the board at the same time that other signal-carrying lines are defined for interconnecting electronic components of the article being tagged. In a preferred tag apparatus, the antenna in the board is wired to standard pads on the external surface of the card. The package is then mounted onto the pads and connected with the antenna by any one of a number of well-known attachment processes e.g. soldering.

It is to be noted that the term printed circuit board as used in the claims includes both rigid circuit boards e.g. FR4, and flexible circuit carriers comprised of polyimide and copper layers. The package in which the semiconductor circuit elements of the tag are housed may be any one of a number of different types in common use e.g. SOJ (small outline j-lead package).

A preferred embodiment of the invention will now be described, by way of example only, with reference to the accompanying drawings in which.

Figure 1:
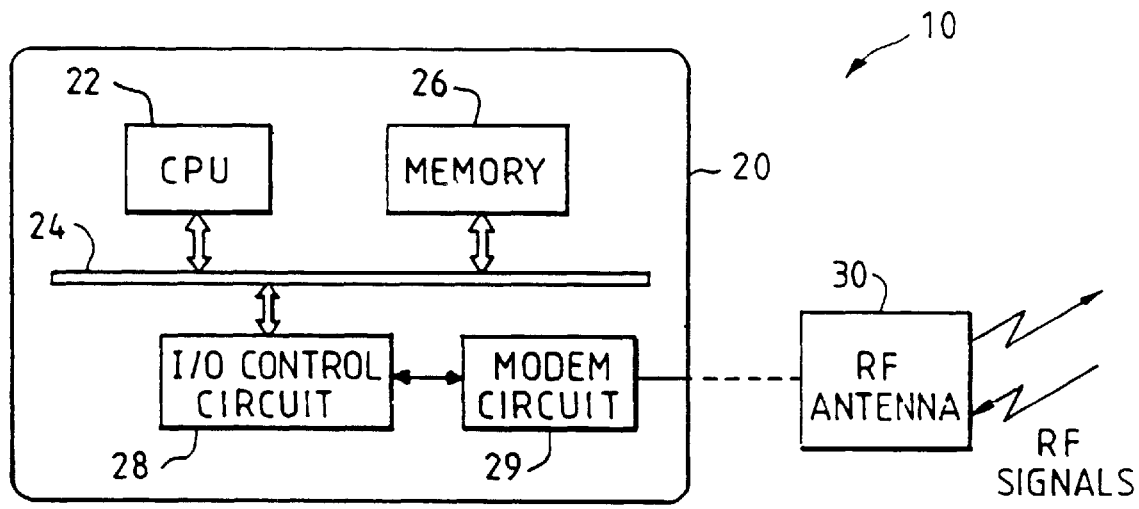
FIG. 1 is a diagrammatical representation of an RF ID tag including various logic and memory components and RF antenna.

FIG. 1 shows in diagrammatical form the components of a passive radio frequency tag 10. As already described, the RF ID tag comprises semiconductor circuitry and an RF antenna which receives RF signals from a base station and transmits RF signals to the base station; the transmitted signals being modulated in accordance with the identification data stored in memory within the tag. The type of identification data stored in the memory will be application dependent and may take any desired form. In a simple tag, the data will be a simple ID code. In more sophisticated applications, the data may further include the date of manufacture and place of manufacture of the article, or possibly the identity of the owner of the article. Thus when the tag is interrogated by a base station, the modulated RF signal identifies the article, to which the tag is attached, to the base station.

As indicated in FIG. 1, the tag comprises various semiconductor components, which are advantageously implemented in a single chip. These components are packaged into a standard electronic package 20 for connection to an RF antenna 30. These components, which control the operation of the tag, include a central processing unit (CPU) 22 connected via bus 24 to memory 26 which can take the form of ROM, RAM or a combination of the two. An input/output control circuit 28 which controls the input and output of data to and from the processor and memory is also connected on the bus 24. The input/output device is connected for communication with a modem circuit 29 which in operation receives and demodulates signals received from the RF antenna 30. Semiconductor circuits used for RF tags are well known and commercially available and as described above may take the form of a single chip. In the preferred embodiment the chip is packaged into a standard electronic package e.g. SOJ for mounting to a printed circuit board.

Figure 2:
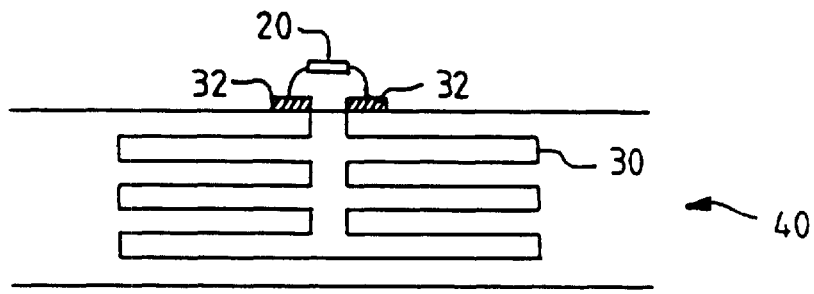
FIG. 2 is a diagrammatical cross-sectional representation of a portion of a printed circuit board, including RF antenna embedded therein, on which is mounted the semiconductor package of FIG. 1.
Figure 3:
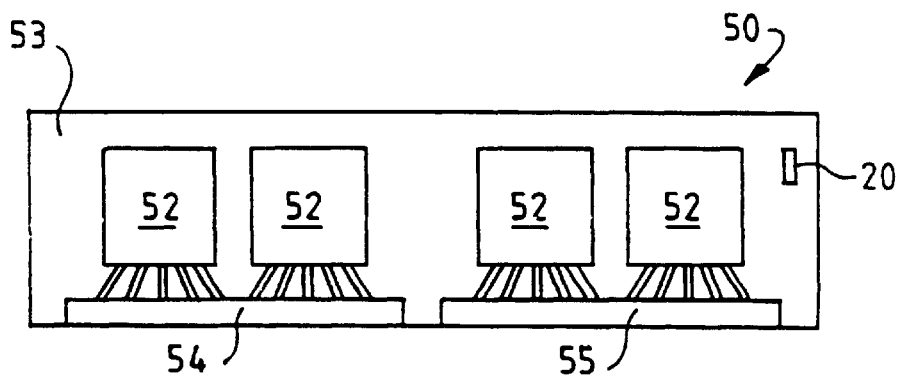
FIG. 3 is a diagrammatical representation of a memory module comprising memory chips and RF tag mounted on a carrier circuit board.

In FIG. 2, there is shown, in cross-section, the packaged RF ID chip 20 in position on a printed circuit board (PCB) 40. According to the present invention, this PCB forms the whole or part of the electrical device which is being tagged. In one preferred embodiment, the PCB is a component of a data processing system e.g. a memory module (SIMM), motherboard or daughterboard of a personal computer system. It will be appreciated that the present invention may be employed on any component of a personal computer which includes a PCB. However, use will generally be restricted to high value components such as memory modules. FIG. 3 shows one type of memory module 50 wherein four memory chips 52 are mounted on a printed circuit board carrier 53. RF tag package 20 is also mounted at a suitable location on the carrier. Connectors 54,55 are provided at one edge of the carrier to allow connection to the motherboard or other component of the computer system.

The RF antenna is defined within a metal layer of the PCB (e.g. FR4 card) during the same manufacturing step or steps, and in the same manner in which other signal carrying circuitry is defined. This process is well known to the skilled man. For example, the signal carrying circuitry and antenna will be defined in the standard 6 mil internal copper trace that is standard in current printed circuit board technology. Other trace sizes can be employed as appropriate. As is shown in FIG. 2, in a preferred embodiment, the antenna 30 takes the form of a coil defined within multiple layers (e.g. 4 to 6) of imbedded copper of the PCB 40. At the surface of the PCB, the coil terminates in connector pads 32. The RF ID chip package is fixed via its connectors to these pads e.g. by conventional soldering techniques.

Alternative antenna configurations may readily be employed depending on the physical constraints imposed by the size and topology of the PCB. The length of the coil is determined by the frequency of the RF signal at which the RF tag is to be operated. In principle, these frequencies can be any frequency that can be transmitted. The actual frequency range (and hence length of coil) chosen will depend on the activation frequencies of the detection/stimulation equipment that is employed to interrogate the tag. Different form factors of antenna would respond to different frequencies.

I claim:

1. Electronic apparatus comprising:

at least one integrated circuit device mounted on a printed circuit board; and a radio frequency tag for tagging the electronic apparatus and comprising signal processing logic and memory contained in an electronic package mounted on the circuit board, the tag further comprising antenna means for receiving radio frequency signals and transmitting radio frequency signals modulated in accordance with apparatus identification data stored in the memory, the antenna means being defined in one or more metal layers of the circuit board and electrically connected to the signal processing logic and memory of the tag via electrical connectors of the electronic package.

2. A memory module comprising:

a plurality of memory chips mounted on a printed circuit board; and a radio frequency tag for tagging the memory module and comprising signal processing logic and memory contained in an electronic package mounted on the circuit board, the tag further comprising antenna means for receiving radio frequency signals and transmitting radio frequency signals modulated in accordance with module identification data stored in the memory, the antenna means being defined in one or more metal layers of the circuit board and electrically connected to the signal processing logic and memory of the tag via electrical connectors of the electronic package.

* * * * *